OVERLAY TRANSISTOR EMPLOYING HIGHLY CONDUCTIVE SEMICONDUCTOR GRID AND METHOD FOR MAKING
Original Filed April 5, 1971
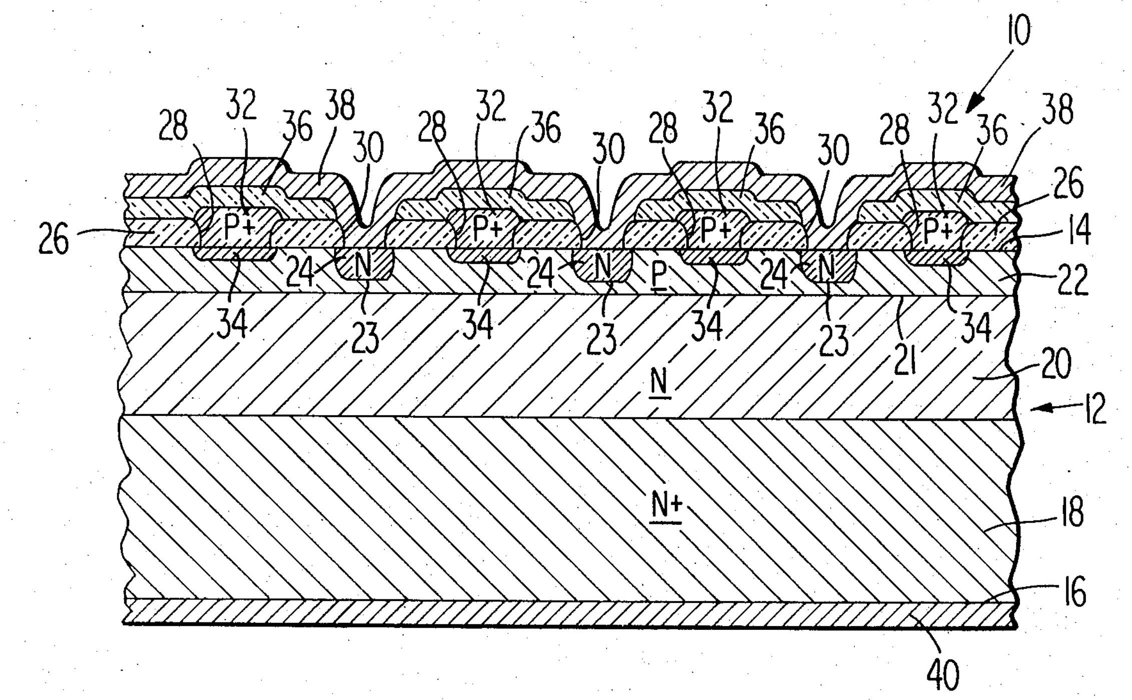
INVENTOR.
Fredric L. Katnack
BY Herbert L. Allen
ATTORNEY

United States Patent Office 3,843,425 Patented Oct. 22, 1974

3,843,425

OVERLAY TRANSISTOR EMPLOYING HIGHLY CONDUCTIVE SEMICONDUCTOR GRID AND METHOD FOR MAKING

Frederic Leroy Katnack, Oldwick, N.J., assignor to RCA Corporation

Original application Apr. 5, 1971, Ser. No. 131,342, now abandoned. Divided and this application Oct. 5, 1972, Ser. No. 295,212
Int. Cl. H01l 7/64
U.S. Cl. 148—187 6 Claims

ABSTRACT OF THE DISCLOSURE

The transistor has base and collector regions, with a plurality of discrete emitter segments extending into the base region from one surface. A highly conductive grid of a semiconductor material surrounds each emitter segment and contacts the base region at the surface.

This is a division, of application Ser. No. 131,342, filed Apr. 5, 1971, now abandoned.

BACKGROUND OF THE INVENTION

The present invention relates to semiconductor devices, and in particular, relates to transistors that are designed to operate at radio frequencies.

The development of the "Overlay" Transistor has been recognized as an important advance in the power and frequency capabilities of RF Transistors; this device is disclosed in U.S. Pat. 3,434,019 to Carley. In an "Overlay" Transistor, the emitter consists of a plurality of discrete segments extending into the base region from the top surface of the device. Base current is evenly distributed around the emitter segments by a diffused, highly conductive grid within the base region which surrounds each of the segments.

Yet, other techniques are necessary to avoid certain limitations of this structure. For example, the deeply diffused highly conductive grid requires the use of relatively thick collector regions. Also, the lateral diffusion of the diffused grid limits close spacing between adjacent emitter segments, which places constraints on the frequency capabilities. Further, the conductivity of the diffused grid cannot be as high as would be desired.

SUMMARY OF THE INVENTION

The present invention comprises an RF Transistor formed in a semiconductor body having a surface. The device includes collector and base regions in the body of first and second conductivity types, respectively, with a portion of the base region extending to the surface. A plurality of discrete first conductivity type emitter segments extend into the base region from the surface; each segment forms an emitter-base PN junction with the base region. A highly conductive grid of semiconductor material of the second conductivity type contacts the base region at the surface and surround each emitter segment.

The invention also includes a method for making a semiconductor device, which method comprises the following steps. A semiconductor body having a region of one conductivity type adjacent a surface of the body is provided. Next, an insulating coating on the surface is treated to form a communicating slot therein which extends to the surface. A layer of semiconductor material is formed in the slot. Impurities of the one conductivity type are then diffused into and through the semiconductor layer to a shallow depth into the region. Then, a plurality of discrete second conductivity segments are diffused into the region from the surface in spaced relation to the semiconductor layer.

THE DRAWING

The single figure of the drawing is a broken cross-section of an RF Transistor made in accordance with the present invention.

DETAILED DESCRIPTION

An RF Transistor made in accordance with the present invention will be described with reference to the drawing.

The RF Transistor, referred to generally as 10, is formed in a semiconductor, e.g. silicon body 12, a portion of which is broken away in the drawing. The body 12 has upper and lower surfaces 14 and 16, respectively. The size, shape, and conductivity of the device is not critical to this invention. By way of example, however, the body 12 may be 60.0 mils long, 30.0 mils wide, and between 4.0 and 8.0 mils thick. While the transistor 10 may be an NPN or PNP device, an NPN device is shown in the drawing and described below.

The transistor 10 includes a collector region within the semiconductor body 12. Preferably, the collector region includes a highly conductive (N+) substrate 18 adjacent the lower surface 16, and a more resistive (N) region 20 adjacent the substrate. A base region 22 of a conductivity type opposite to that of the collector region 20 (P type in this example), extends into the collector region 20 from the upper surface 14, and is separated therefrom by a base-collector PN junction 21. The dimensions of the collector and base regions 20 and 22 are not critical. However, both regions are suitably as thin as is possible, consistent with other design criteria. By way of example, the collector region 20 may be between 0.2 and 2.0 mils thick, and the base region 22 preferably extends no more than 0.2 mils into the collector region 20.

A plurality of emitter segments 24 of the same conductivity as the collector region 20 extend into the base region 22 of the upper surface 14. Each segment 24 forms an emitter-base PN junction 23 with the base region 22.

An insulating coating 26 of, for example, silicon dioxide or silicon nitride, is disposed on the upper surface 14. In practice, the insulating coating 26 is very thin, on the order of 5,000 to 20,000 A. thick. In order to clearly describe the invention, however, the thickness of the coating 26, and other deposited layers described below, are exaggerated in the drawing. The coating 26 has a communicating slot 28 therein which surrounds each emitter segment 24 and extends to the upper surface 14.

A highly conductive (P+) semiconductor layer of the same conductivity type as the base region 22 is disposed in the communicating slot 28 to form a grid 32 which contacts the base region 22 and surrounds each emitter segment 24. The semiconductor grid 32 need not be of the same semiconductor material as the body 12, but suitably it is so; thus, when the body 12 is silicon, as in this example, the grid 32 also comprises silicon, and may be monocrystalline or polycrystalline silicon. By way of illustration, the grid 32 may be between 5,000 and 25,000 A. thick, and may have an impurity concentration of between $10^{19}$ and $10^{21}$ atoms/cm.$^3$.

Disposed just underneath the grid 32 and in the base region 22 below the upper surface 14 is a corresponding shallow diffused grid 34 of high conductivity. Preferably, this shallow grid 34 does not extend into the base region 22 beyond the depth of the emitter segments 24.

A second insulating coating 36 overlies the semiconductor grid 32. Both insulating coatings 36 and 26 have openings 30 that extend through both coatings to the upper surface 14. Each opening 30 exposes an emitter segment 24, so that an emitter contact layer 38 can interconnect all of the emitter segments. A base contact (not shown) makes ohmic contact to the semiconductor grid 32, and the transistor is completed with a collector contact 40 on the lower surface 16.

The base and collector regions of the transistor 10 may be made by fabrication techniques well known in the art. The semiconductor grid 32 is suitably formed by the hydrogen reduction of silicon tetrachloride or silane. When the silicon is deposited at relatively low temperatures, e.g., below 850° C., a polycrystalline silicon layer is deposited over the insulating coating 26 and in the slot 28. A photolithographic sequence is then used to define the grid 32 only in the slot 28. When the silicon is deposited at relatively high temperatures, e.g. above 850° C., a monocrystalline silicon grid 32 is formed only in slot 28.

Thereafter, a high concentration of P type impurities are diffused into the grid 32, and preferably through the grid to a shallow depth into the base region 22 underneath, to form the shallow diffused grid 34 in the base region next adjacent the grid 32. Next, the cross-over insulating coating 36 is deposited, as for example, by any known silicon dioxide forming technique. The insulating coatings 28 and 36 are then treated to form the emitter openings 30. An emitter segment 24 is then diffused through each opening 30, and the emitter contact layer 38 is deposited. Base and collector contacts are then provided and the transistor 10 is soldered or brazed into a package.

A transistor in accordance with this invention has several advantages. For example, relatively thin collector regions can be employed. Further, the emitter segments can be closely spaced relative to prior art devices, and may be diffused after formation of the grid 32. In addition, the deposited semiconductor grid 32 of the present invention can be made very highly conductive.

What is claimed is:

1. A method for making a semiconductor device, comprising the steps of:

providing a semiconductor body having a region of a first conductivity-type therein adjacent one surface of the body, with an insulating coating on said surface;

forming a communicating slot in said coating which extends to said surface;

forming a semiconductor layer of said first conductivity type in said slot which contacts said region;

diffusing impurities of said one conductivity-type into said semiconductor layer so that said layer is highly conductive with respect to said region; and diffusing a plurality of segments of a second conductivity-type into said region from said surface is spaced relation to said semiconductor layer.

2. A method according to claim 1, further including, during said impurities diffusion step, the step of diffusing impurities through said semiconductor layer to a shallow depth into said region, so that the portion of said region in said shallow depth is highly conductive with respect to the remainder of said region.

3. A method according to claim 1, wherein said semiconductor body and said semiconductor layer comprise silicon.

4. A method according to claim 3, wherein said semiconductor layer forming step comprises the step of depositing a substantially monocrystalline silicon layer only in said slot.

5. A method according to claim 3, wherein said semiconductor layer forming step comprises:

depositing a substantially polycrystalline silicon layer in said slot and on said coating; and treating said layer to remove that portion of said layer on said coating.

6. A method according to claim 2 in which said highly conductive, shallow depth portion has a depth no greater than that of said segments of said second conductivity-type.

References Cited

UNITED STATES PATENTS

| | | | |
|---|---|---|---|
| 3,434,019 | 3/1969 | Carley | 317—235 |
| 3,443,175 | 5/1969 | Czorny et al. | 317—235 |
| 2,858,489 | 10/1958 | Henkels | 317—235 |
| 3,156,591 | 11/1964 | Hale et al. | 148—175 |
| 3,296,040 | 1/1967 | Wigton | 148—175 |
| 3,488,835 | 1/1970 | Becke et al. | 29—577 |
| 3,548,233 | 12/1970 | Cave et al. | 317—235 X |
| 3,619,738 | 11/1971 | Otsuka | 317—235 |

L. DEWAYNE RUTLEDGE, Primary Examiner

J. M. DAVIS, Assistant Examiner

U.S. Cl. X.R.

148—175, 188; 317—235

UNITED STATES PATENT OFFICE

CERTIFICATE OF CORRECTION

Patent No. 3,843,425 Dated October 22, 1974

Inventor(s) Fredric Leroy Katnack et al.

It is certified that error appears in the above-identified patent and that said Letters Patent are hereby corrected as shown below:

In the heading to the printed specification, line 5, after "Oldwick, N. J." insert -- Michael Frank DeLise, Warminster, Pa., and Eugene Leon Jordan, Piscataway, N.J. --.

Signed and Sealed this

Thirtieth Day of November 1976

[SEAL]

Attest:

RUTH C. MASON
*Attesting Officer*

C. MARSHALL DANN
*Commissioner of Patents and Trademarks*